United States Patent
Polak et al.

(10) Patent No.: US 11,486,953 B2
(45) Date of Patent: Nov. 1, 2022

(54) PHASE ESTIMATION FOR RETROSPECTIVE MOTION CORRECTION

(71) Applicants: Siemens Healthcare GmbH, Erlangen (DE); The General Hospital Corporation, Boston, MA (US)

(72) Inventors: Daniel Polak, Erlangen (DE); Kawin Setsompop, Charlestown, MA (US); Stephen Farman Cauley, Somerville, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 0 days.

(21) Appl. No.: 17/465,014

(22) Filed: Sep. 2, 2021

(65) Prior Publication Data
US 2022/0065971 A1   Mar. 3, 2022

Related U.S. Application Data

(60) Provisional application No. 63/074,205, filed on Sep. 3, 2020.

(51) Int. Cl.
*G01R 33/565*   (2006.01)
*G01R 33/56*    (2006.01)
*G01R 33/561*   (2006.01)

(52) U.S. Cl.
CPC ... *G01R 33/56509* (2013.01); *G01R 33/5608* (2013.01); *G01R 33/5611* (2013.01)

(58) Field of Classification Search
CPC ............ G01R 33/5608; G01R 33/5611; G01R 33/56509
See application file for complete search history.

(56) References Cited

U.S. PATENT DOCUMENTS

| | | | |
|---|---|---|---|
| 2016/0003928 A1* | 1/2016 | Chen | G01R 33/4822 324/309 |
| 2019/0004132 A1* | 1/2019 | Tan | G01R 33/5611 |

OTHER PUBLICATIONS

Samsonov, A.A., Kholmovski, E.G., Parker, D.L. and Johnson, C.R. (2004), POCSENSE: POCS-based reconstruction for sensitivity encoded magnetic resonance imaging. Magn. Reson. Med., 52: 1397-1406. https://doi.org/10.1002/mrm.20285 (Year: 2004).*

(Continued)

*Primary Examiner* — Gregory H Curran
(74) *Attorney, Agent, or Firm* — Banner & Witcoff Ltd.

(57) ABSTRACT

Techniques are disclosed related to the compensation of phase variations introduced into k-space lines, which cause imaging artifacts. The techniques utilize the detection of motion via an encoding plus motion model, which does not require the use of additional prospective or retrospective motion detection techniques. The techniques described herein use the encoding plus motion model to reconstruct an initial image from a set of motion states, and then calculate phase information from images that are projected form the initial reconstructed image using a projection onto convex sets (POCS). The phase information is incorporated into the encoding plus motion model over several iterations to minimize data consistency error, thereby generating a refined image that compensates for patient motion over the set of motion states.

20 Claims, 5 Drawing Sheets

(56) References Cited

OTHER PUBLICATIONS

Cordero-Grande, L. et al. "Motion corrected MRI with DISORDER: Distributed and Incoherent Sample Orders for Reconstruction Deblurring using Encoding Redundancy" Magnetic Resonance in Medicine, vol. 84, No. 2, pp. 713-726, Aug. 2020 (Submitted on Oct. 1, 2019 to arXiv.org (arXiv:1910.00540)) // https://doi.org/10.1002/mrm.28157.
Bilgic, Berkin et al., "Wave-CAIPI for Highly Accelerated 3D Imaging", Magnetic Resonance in Medicine, vol. 73, No. 6, pp. 2152-2162, 2015 // DOI: 10.1002/mrm.25347.
Haskell, M. W. et al. "TArgeted Motion Estimation and Reduction (TAMER): Data Consistency Based Motion Mitigation for MRI using a Reduced Model Joint Optimization" IEEE, vol. 37, Nr. 5, pp. 1253-1265, 2018 // DOI 10.1109/TMI.2018.2791482.
Uecker, Martin et al.: "ESPIRiT—An Eigenvalue Approach to Autocalibrating Parallel MRI: Where Sense Meets GRAPPA"; in Magnetic Resonance in Medicine; vol. 71; pp. 990-1001; 2014.
Polak D. et al: "Scout Acquisition enables rapid Motion Estimation (SAME) for retrospective motion mitigation,", in Proceedings of ISMRM 28th Annual Meeting, 2020.

* cited by examiner

PHASE ESTIMATION FOR RETROSPECTIVE MOTION CORRECTION

CROSS-REFERENCE TO RELATED APPLICATIONS

The present application claims the benefit of and priority to U.S. provisional patent application No. 63/074,205, filed on Sep. 3, 2020, the contents of which are hereby incorporated by reference in their entirety.

TECHNICAL FIELD

The present disclosure concerns phase estimation techniques and, in particular, techniques that utilize phase variation estimations to perform motion correction in magnetic resonance imaging (MRI) scans.

BACKGROUND

Patient motion is one of the most common and costly types of MRI artifacts. Several types of motion correction techniques for MRI scans have been conventionally used to reduce artifacts caused by the motion of an imaged object. These include so called "prospective" and "retrospective" motion correction techniques. Prospective motion correction techniques may utilize camera systems or additional imaging data (e.g. navigators) to collect information regarding the motion states of a patient during the scanning process. Prospective motion correction techniques thus provide real time motion feedback that can be used to update acquisition parameters during the encoding process. Conversely, retrospective motion correction techniques do not update acquisition parameters in real-time, but instead gather motion information during a scan, which is then incorporated into the reconstruction process by updating the k-space trajectory to achieve motion correction.

However, these techniques fail to provide appropriate image quality for certain imaging sequences (e.g., gradient echoes), which are susceptible to inhomogeneities of the main magnetic field (i.e. the B0 field). These magnetic field variations typically result in large phase variations due to subject motion. Current motion correction techniques neglect the orientation dependence of these phase variations, which may result in poor reconstruction quality. Moreover, phase variations may also impair the accuracy of the motion parameter search/estimation using navigator-free retrospective correction techniques. As a result, conventional MRI motion correction techniques are inadequate.

SUMMARY

As noted above, conventional motion correction techniques for MRI scans fail to consider the orientation dependence of phase variations caused by a patient's motion during imaging scans, which may result in poor reconstruction quality. In particular, the inhomogeneity of the main magnet field (referred to as a B0 field) is spatially dependent and thus, in many types of MR imaging scans, the phase does not rotate in the same manner as the magnitude of the object being imaged when there is motion during scanning. For instance, if a patient turns his head during an MR imaging scan, the phase may rotate in a direction that is different than the direction of motion. This is further exasperated by the interaction of different tissue types with the B0 field, in particular air gaps in imaged tissue, which results in a non-rigid rotation of the phase. Therefore, current solutions that implement the SENSitivity Encoding (SENSE) plus motion model, which assumes rigidity in motion, do not account for such phase mismatches, resulting in imaging artifacts when the image is reconstructed from the acquired MR data.

The aspects described herein compensate for the aforementioned phase offsets or variations due to the motion of an object during scanning, which may be introduced into k-space lines of the acquired MR data, and thus reduce or eliminate imaging artifacts in the resulting reconstructed images. The techniques described herein utilize the detection of motion via a SENSE plus motion model, which does not require the use of real-time motion tracking and thus obviates the need for external prospective motion tracking devices such as cameras. The techniques described herein use the SENSE plus motion model to reconstruct an initial image from a set of motion states, and then calculate phase information from images that are projected from the initial reconstructed image using a projection onto convex sets (POCS) algorithm. The phase information is then incorporated into the SENSE plus motion model over several iterations to minimize data consistency error, thereby compensating for patient motion over the set of motion states to generate a refined image with reduced (or eliminated) motion artifacts.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
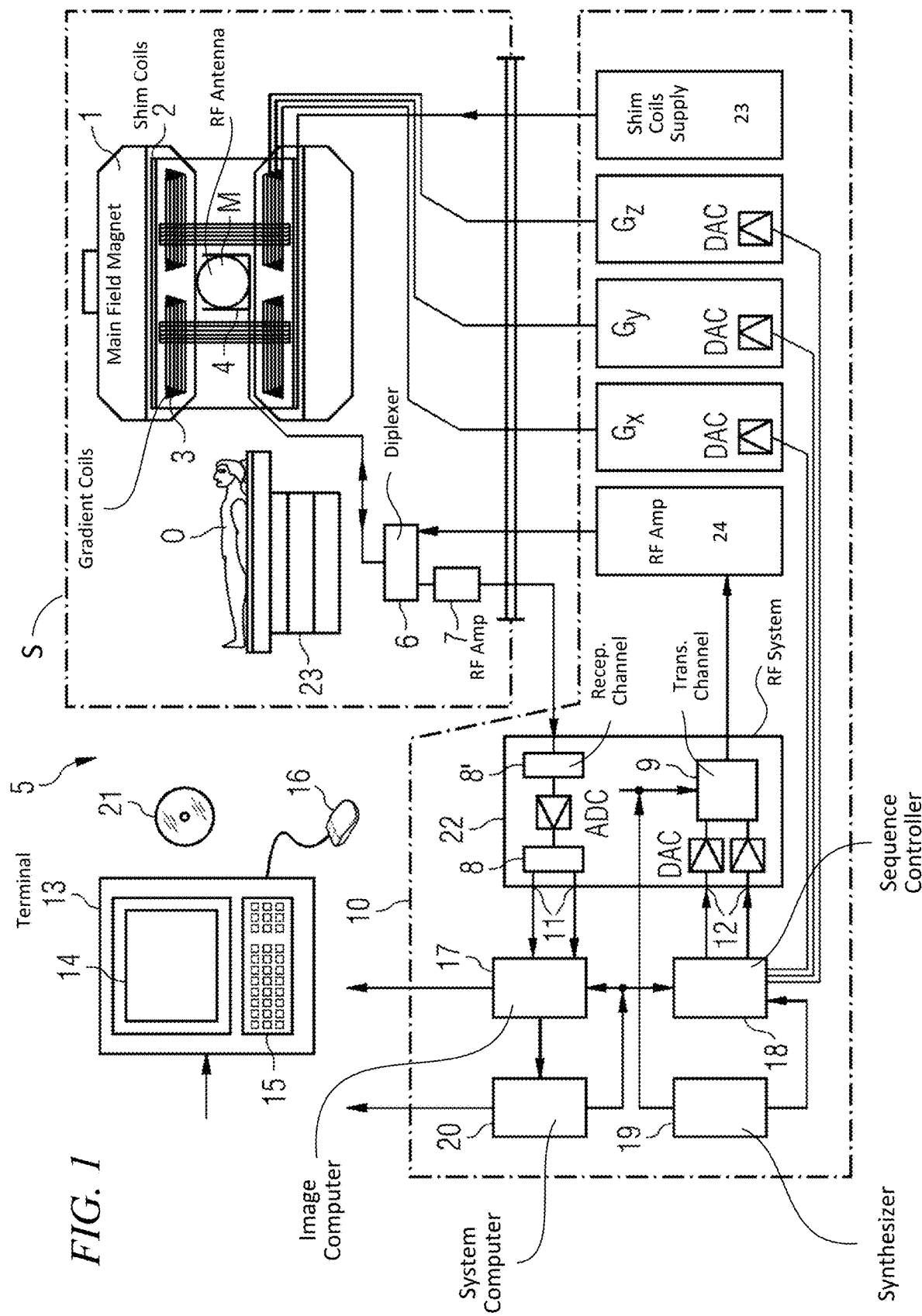
FIG. 1 illustrates a representation of a magnetic resonance device, in accordance with an exemplary embodiment of the present disclosure.

FIG. 1 illustrates a representation of a magnetic resonance device, in accordance with an exemplary embodiment of the present disclosure. The components within the dot-dash outline S are commonly called a magnetic resonance scanner, a magnetic resonance data acquisition scanner, or simply a scanner. The components within the dot-dash outline 10 are commonly called a control unit, a control device, or a control computer. The magnetic resonance apparatus 5 may include additional, fewer, or alternate components that are not depicted in FIG. 1 for purposes of brevity. For instance, the magnetic resonance apparatus 5 may alternatively include, or include in addition to the DVD 21, one or more non-transitory computer-readable data storage media in accordance with various embodiments of the present disclosure. Thus, the aforementioned non-transitory computer-readable media may be loaded, stored, accessed, retrieved, etc., via one or more components accessible to, integrated with, and/or in communication with the magnetic resonance apparatus 5 (e.g., network storage, external memory, etc.). For example, such data-storage mediums and associated program code may be integrated and/or accessed via the terminal 13, the control device 10 or components thereof such as the control computer 20, the image computer 17, the sequence controller 18, the RF system 22, etc.

As shown in FIG. 1, a magnetic resonance apparatus 5 (e.g., a magnetic resonance imaging or tomography device) is shown. A main field magnet system 1 generates a temporally-constant strong magnetic field (main magnetic field or B0 field) for the polarization or alignment of the nuclear spin in a region of an examination subject or object O, such as a portion of a human body that is to be examined, and who is lying on a table 23 to be moved into the magnetic resonance apparatus 5. The high degree of homogeneity in the magnetic field generated via the main field magnet system 1 necessary for the magnetic resonance measurement (data acquisition) is defined in a typically sphere-shaped measurement volume M, in which the portion of the human body that is to be examined is placed. To support the homogeneity requirements, temporally-constant effects are eliminated by shim-plates made of ferromagnetic materials that are placed at appropriate positions. Temporally-variable effects are eliminated by shim-coils 2 and an appropriate control unit 23 for the shim-coils 2.

A cylindrically-shaped gradient coil system 3 (or alternatively, gradient field system) is incorporated in the main field magnet system 1, composed of three windings. The gradient coil system 3 is also used to apply a magnetic field gradient, which determines the magnetic resonance frequency (Larmor frequency) at the respective location. Each winding is supplied by a corresponding amplifier Gx, Gy, and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each corresponding amplifier Gx, Gy, and Gz has a digital-analog converter (DAC), controlled by a sequence controller 18 for the accurately-timed generation of gradient pulses. The gradient field system 3 may utilize one or more of the first, second, or third partial windings of the gradient field system 3 to generate one or more gradients in one or more of the x-axis, the y-axis, and/or the z-axis using a respective Gx, Gy, and/or Gz amplifier. The generated gradients may be used in conjunction with a transmitted RF pulse, as further discussed herein, to receive and process data during acquisition time periods referred to as echoes. The embodiments described herein may implement gradient pulses to receive MR data using imaging echoes for the purpose of image reconstruction during imaging echoes, and optionally receive MR data using non-imaging echoes to estimate motion, as further discussed herein.

A radio-frequency (RF) antenna 4 is located within the gradient field system 3 and is used to convert the RF pulses provided by a radio-frequency power amplifier 24 into a magnetic alternating field for the excitation of the nuclei by tipping ("flipping") the spins in the subject or the region thereof to be examined from the alignment produced by the magnetic field generated via the main field magnet system 1. To do so, the radio-frequency antenna 4 is comprised of one or more RF transmitting coils and one or more RF receiving coils in the form of an annular, linear, or matrix type configuration of coils. As the excited nuclear spins relax, RF signals, referred to as magnetic resonance (MR) signals, are emitted in a resonant manner, being received by the RF antenna 4 and then further processed as discussed below.

Thus, the alternating field based on the precessing nuclear spin, i.e., the nuclear spin echo signal normally produced from a RF pulse sequence composed of one or more RF pulses and one or more gradient pulses, is also converted by the RF receiving coils of the radio-frequency antenna 4 into a voltage (measurement signal), which is transmitted to a radio-frequency system 22 via an RF amplifier 7 of a radio-frequency receiver channel 8, 8'. Acquisition of the MR signals takes place in the spatial frequency space or "k-space," with k-space being temporally traversed along a "gradient trajectory" that is defined by the switching of the gradient pulses during measurement while the RF pulses are transmitted in a time-coordinated manner. In other words, the MR signals are recorded as "raw data" in k-space along a particular k-space trajectory that is dependent upon the timing of the particular transmitted gradient pulse sequence. As further discussed below, the desired image data can then be reconstructed from the recorded raw data in k-space thus acquired by means of a two-dimensional Fourier transform.

The radio-frequency system 22 further includes a transmitting channel 9, in which the RF pulses for the excitation of the magnetic nuclear resonance are generated. For this purpose, the respective RF pulses are digitally depicted in the sequence controller 18 as a series of complex numbers, based on a given pulse sequence provided by the system computer 20. This number series is sent via an input 12, in each case, as real and imaginary number components to a digital-to-analog converter (DAC) in the radio-frequency system 22 and from there to the transmitting channel 9. The pulse sequences are modulated in the transmitting channel 9 to a RF carrier signal, the base frequency of which corresponds to the resonance frequency of the nuclear spin in the measurement volume. The modulated pulse sequences of the RF transmitter coil are transmitted to the RF antenna 4 via an amplifier 24. Although a single transmission channel and receiving channel are shown and described with reference to FIG. 1, this is for purposes of brevity and provided by way of example and not limitation. The embodiments herein include acquiring MR signals using any suitable type of imaging technique. Thus, the magnetic resonance apparatus 5 may include any suitable number of receiving and/or transmission channels configured for this purpose, and the radio-frequency system 22 may be further modified to facilitate the control, transmission, and reception of data in accordance with any suitable number of channels.

Switching from a transmitting to a receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17.

Therefore, generally predefined pulse sequences determined during measurement, in other words sequences of defined RF pulses as well as gradient pulses in different directions and read-out windows, are used to activate a magnetic resonance tomography system while the receive antennas are switched to receive, and the MR signals are acquired via the process of receiving, processing, and recording these signals as raw data in k-space. To do so, the predefined pulse sequences are generally established beforehand in accordance with any suitable type of measurement protocol together with other control data for the measurement.

In an image processor or image computer 17, an MR image is reconstructed from the measurement data (e.g. the raw data recorded in k-space, which may be referred to herein as acquired k-space data) obtained in this manner, which includes computation of at least one disturbance matrix and the inversion thereof, in the image processor 17. The management of the measurement data, the image data, and the control program occurs via the system computer 20. The sequence controller 18 controls the generation of the desired pulse sequences and the corresponding scanning of k-space with control programs. The sequence controller 18 controls accurately-timed switching (activation) of the gradients, the transmission of the radio-frequency pulse with a defined phase amplitude, and the reception of the magnetic resonance signals. The time base for the radio-frequency system 22 and the sequence controller 18 is provided by a synthesizer 19. The selection of appropriate control programs for the generation of an MR image, which are stored, for example, on a DVD 21 or other suitable storage media, as well as other user inputs such as any suitable number N of adjacent clusters, collectively cover the desired k-space. The display of the generated MR images may thus be facilitated via a terminal 13, which includes units for enabling input entries, such as, e.g. a keyboard 15, and/or a mouse 16, and a unit for enabling a display, such as, e.g. a display screen 14.

Thus, the magnetic resonance apparatus 5 as shown in FIG. 1 may include various components to facilitate the measurement, collection, and recording of MR signals as raw data, as well as reconstructing image data from the measured MR signals that are recorded as raw data into an arrangement of k-space. The embodiments described herein are directed to the compensation of motion-induced phase variations that are introduced as a result of motion of an object during acquisition of the MR signals by the control device 10 as discussed above. Unless otherwise noted, the embodiments described herein may be implemented via one or more of the components of the control device 10, such as the system computer 20, the image computer 17, etc. The phase-variation compensation techniques as discussed herein may be implemented as an algorithm, for example, which is enabled via execution of computer-readable instructions by one or more of the components of the control device 10. The computer-readable instructions may be stored in any suitable type of machine-readable medium (e.g. a non-transitory computer-readable medium) integrated with the control device 10 or other suitable location accessible via the control device 10. Furthermore, the embodiments described herein may perform motion-induced phase variation compensation in accordance with any suitable MRI scanning techniques to reduce or eliminate artifacts that would otherwise occur in the resulting reconstructed clinical MR images. For example, the magnetic resonance apparatus 5 is configured to perform MRI imaging scans in accordance with any suitable sequence and/or techniques, e.g., 2D slice-by-slice or 3D volume acquisitions that may incorporate advanced encoding techniques, such as Simultaneous Multi-Slice (SMS) or Controlled Aliasing in Parallel Imaging Results in Higher Acceleration (CAIPRINHA).

To do so, the embodiments described herein determine motion from the acquired k-space data using a SENSE plus motion model in contrast to the use of measured motion information navigators or tracking devices, and then implement POCS algorithms to incorporate phase information into the SENSE plus motion model to iteratively refine images reconstructed in this manner. To implement this process, it is recognized that the entire acquisition time period used to generate a desired MR image may be portioned or "binned" into any suitable number of motion states or "shots," each representing a respective sampling period over which the MR signals are measured and recorded as raw data into an arrangement of k-space. Each shot or motion state thus represents a time period that is a portion of the entire acquisition time period from which a desired clinical image is to be reconstructed. As examples, each motion state or shot may be identified with a time period such as 5 seconds, 10 seconds, etc. Although the term "motion state" is used herein, this does not mean that motion of the object necessarily occurs within each motion state. Instead, the motion states represent a sampling time period over which motion of the object could potentially occur and, if so, the embodiments described herein may be used to compensate for phase variations that would otherwise result in artifacts in the reconstructed clinical MR images due to this motion.

The MR signals of the object are acquired by the radio frequency system 22 receiving the MR signals via the receiving channel(s). Again, these MR signals are the result of the precessing nuclear spins of the object in response to a transmitted imaging pulse sequence. The acquired MR signals may thus be acquired for the entire acquisition time period, which again includes any suitable number N of the aforementioned shots or motion states. The MR signals acquired over the entire acquisition time period may thus be recorded and stored in a suitable memory that is, for instance, integrated as part of the MR apparatus 5 or otherwise accessible by the MR apparatus 5. The MR signals may then be used to generate raw k-space data in accordance with known techniques, which is associated with the entire acquisition period of N motion states or shots. In an embodiment, the acquired k-space data associated with the overall acquisition time period may be stored in any suitable type of memory. The k-space data for the entire acquisition period may be stored in a manner such that k-space data is correlated or binned by each respective motion state.

The embodiments described herein may be implemented as post-processing operations. Therefore, motion parameters may be obtained from the MR data acquired during the entire acquisition time period, which may describe motion of the object during each motion state. In general, the motion parameters are six parameters used to describe the position and orientation of the object from which the translational and rotational motion between time points can be determined. If motion is restricted or assumed to be only 1D, this reduces to one position parameter and, if motion is assumed to be 2D, two position and one orientation parameters are needed. In accordance with various embodiments, the motion parameters may be determined from the MR data acquired during the entire acquisition time period in accordance with any suitable type of techniques, including known techniques.

For instance, the motion parameters may be calculated using MR-based motion tracking algorithms, which acquire at least two MR data sets at different time points and compare these data sets to determine motion without the need for additional hardware. As is known, pose changes can be calculated by registration algorithms or by comparison to training data sets on the basis of 3D volumes, slices, or 1D, 2D or 3D navigators.

As another example, motion estimation techniques may be implemented that utilize one or more echoes, which may or may not be used for imaging purposes. For instance, for gradient echo sequences (GRE) and susceptibility weighted imaging (SWI), phase variations during imaging as a result of object motion may impair the quality of the motion parameter estimation using navigator-free retrospective motion techniques. Thus, to reduce such inaccuracies, embodiments include estimating the motion parameters from k-space data acquired during a relatively small echo time (TE) period. That is, motion estimation is easier for the first echo, as the amount of phase variation due to motion increases linearly with TE for a small TE, and thus results in negligible phase variations. That is, by using an echo with an adequate small TE, the phase estimation may be "decoupled" from the motion estimation of the object, as a small TE ensures little phase difference across different motion states even when object motion does exist. Thus, the estimation of the motion parameters may be performed by assuming a negligible phase variation between motion states, which facilitates a simplified motion estimation process. Then, once the motion parameters are estimated in this manner, the phase estimation may be calculated via the use of the phase-variation compensation algorithm, as discussed in further detail below.

Figure 4:
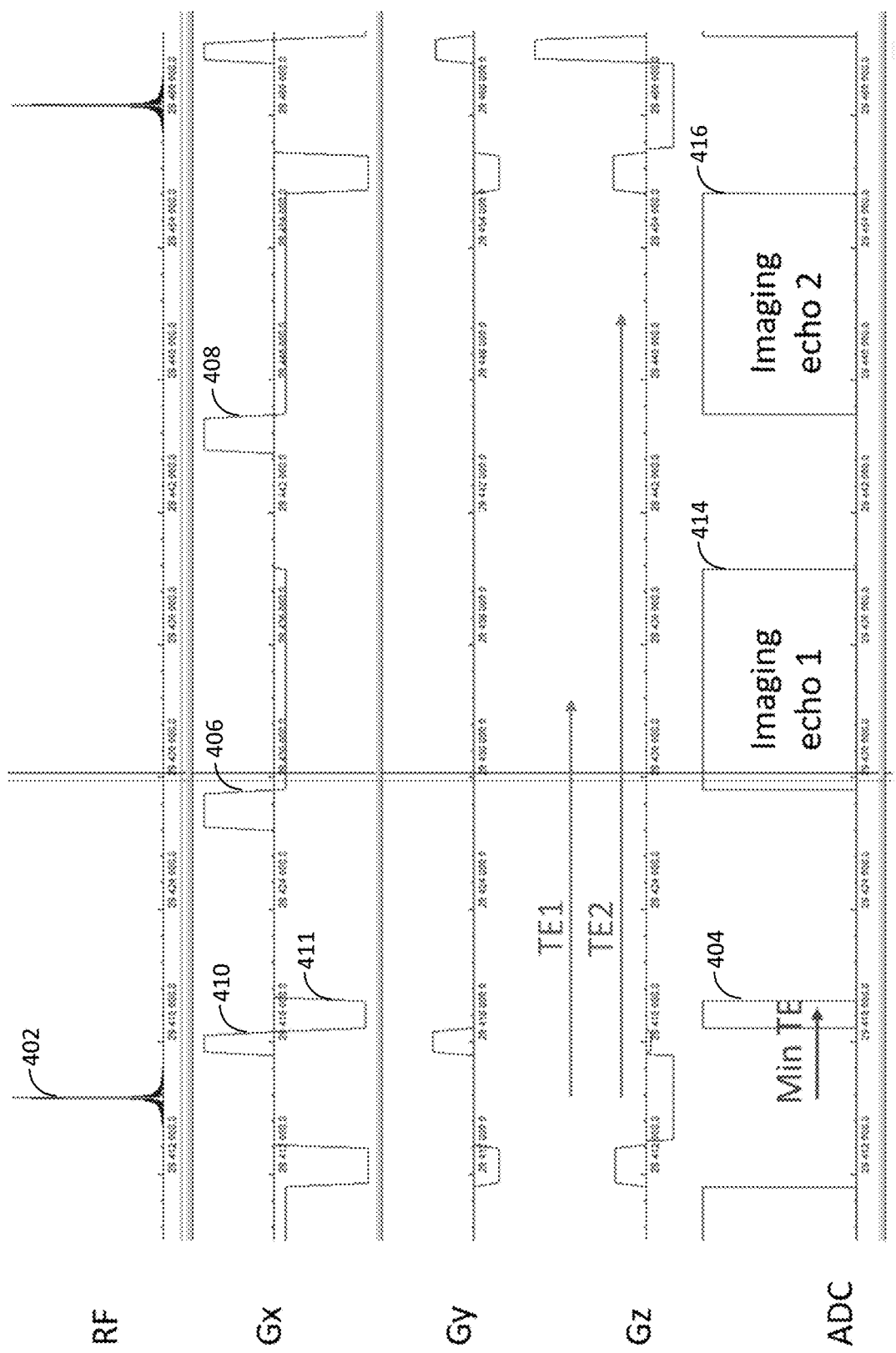
FIG. 4 is an example timeline for introducing an additional gradient and echo for motion estimation, in accordance with an exemplary embodiment of the present disclosure.

An example of acquiring motion parameters using a non-imaging echo is illustrated with reference to FIG. 4, which shows an example timeline for introducing an additional echo for motion estimation, in accordance with an exemplary embodiment of the present disclosure. With reference to FIG. 4, and using GRE or SWI techniques as an illustrative example, motion estimation may be implemented by acquiring k-space data for this purpose using the additional magnetic field gradient 410/411, which is shown in FIG. 4 in the x-direction by way of example and not limitation. The magnetic field gradient 410 thus functions as a rewinder gradient, whereas the magnetic field gradient 411 functions to "move" through the remainder of k-space to facilitate acquisition of k-space data during an acquisition time period identified with the non-imaging echo 404, which is associated with the ADC receiving the MR signals via the radio-frequency receiver channel 8, 8'. The k-space data may thus be acquired during the non-imaging echo 404 shortly after the RF pulse 402 is transmitted ("Min TE"), ensuring that motion-induced phase variations are minimized (or at least reduced) compared to the longer TE times of TE1 and TE2. The magnetic field gradients 406, 408 are respectively identified with the imaging echoes 414, 416, which have longer TE times TE1, TE2, during which MR signals may be acquired for image reconstruction.

Thus, in the example shown in FIG. 4, the echo 404 represents a non-imaging echo, during which k-space data is acquired and, in turn, the motion parameters for each respective motion state. Continuing this example, the non-imaging echo 404 has a TE that is less than a TE associated with the imaging echoes 414, 416. The TE of the non-imaging echo 404 may be any suitable time period that adequately ensures that phase variations due to motion of the object being scanned are minimized or reduced. For example, the "Min TE" value may be less than 10 milliseconds, less than 5 milliseconds, less than 3 milliseconds, less than 2 milliseconds, etc.

The echo used for motion parameter estimation is not limited to non-imaging echoes, although this may be preferred when the imaging echoes have TEs of longer than 10 milliseconds. For instance, if the imaging echo 414 has an adequately short TE time (e.g. less than 15 milliseconds, less than 10 milliseconds, etc.), then the imaging echo 414 may alternatively or additionally be implemented to acquire k-space data that is used for estimation of the motion parameters. This may be the case for certain types of MRI scans in which the first imaging echo 414 is generally not well suited for image reconstruction due the relatively low contrast when used in the reconstructed image, but nonetheless has a low TE1 such that phase variations are significantly reduced as compared to subsequent imaging echoes with longer TE times.

Figure 2:
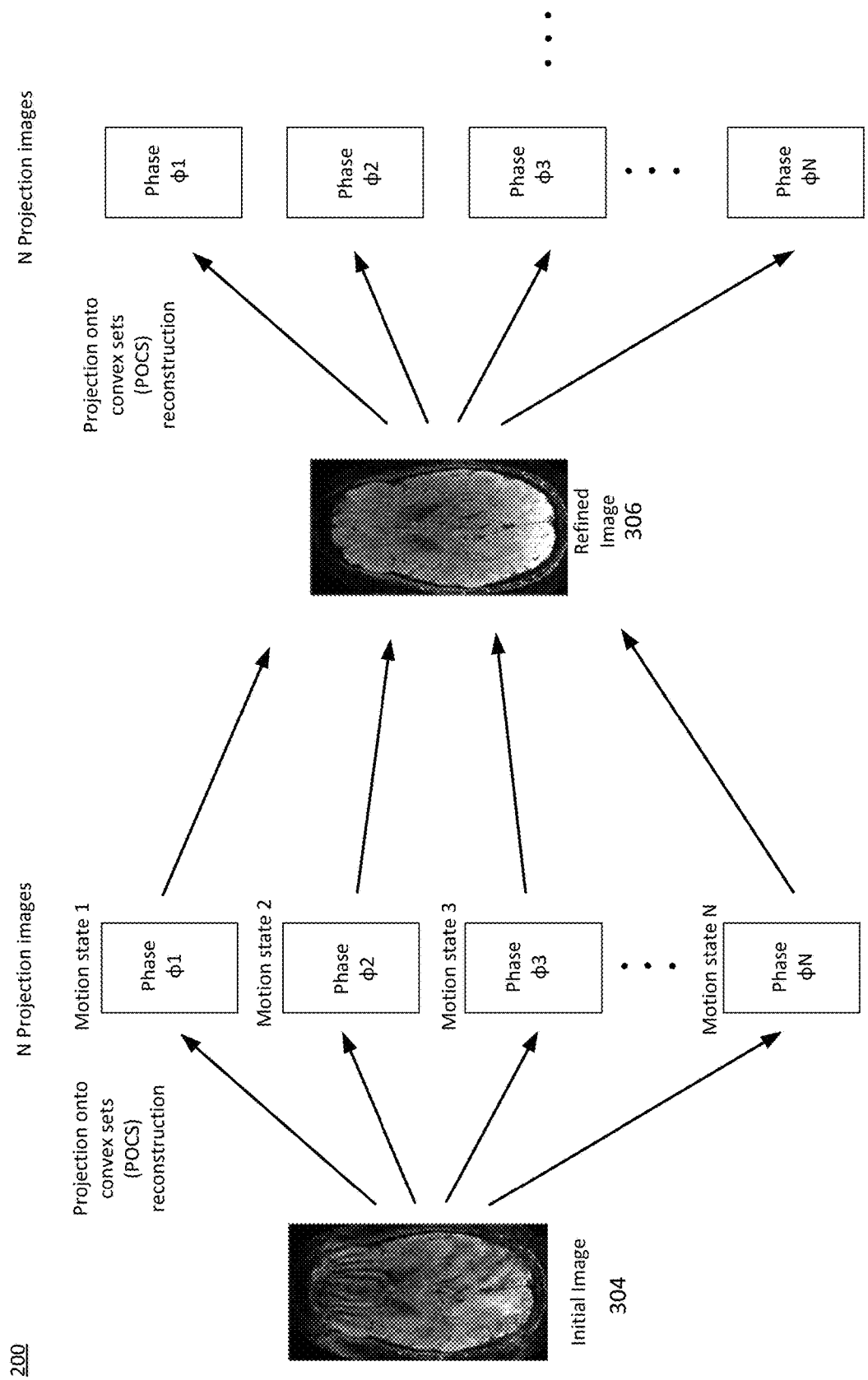
FIG. 2 illustrates an example overview of a technique to compensate for phase variations due to movement of an object during a magnetic resonance imaging (MRI) scan, in accordance with an exemplary embodiment of the present disclosure.
Figure 3:
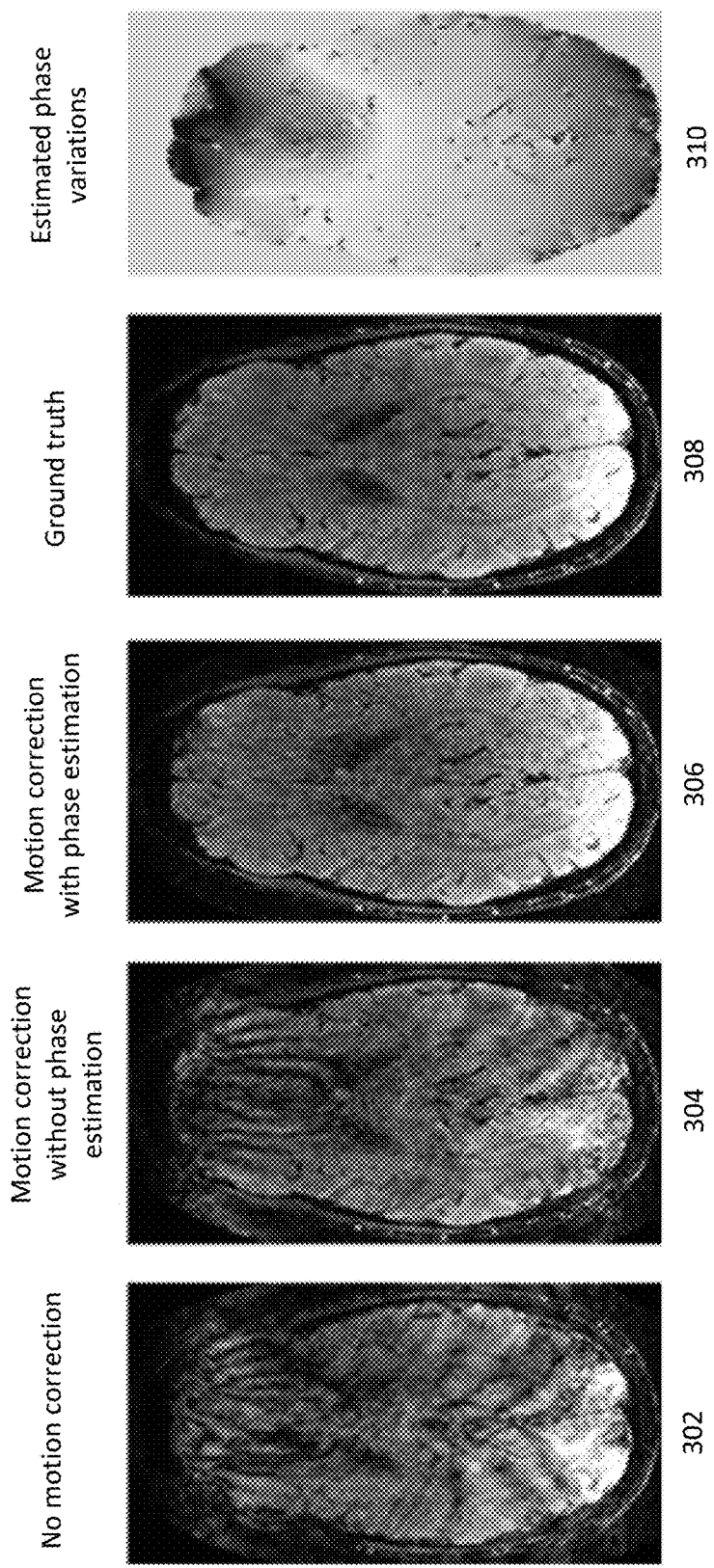
FIG. 3 illustrates example images acquired via MR scans, in accordance with an exemplary embodiment of the present disclosure.

Turning now to FIG. 2, the MR data acquired over the entire acquisition time period may be used to initially generate a reconstructed clinical MR image, which compensates for object motion but not for the phase variations caused by the object motion during any of the motion states as mentioned above due to the use of the SENSE plus motion model assuming rigid motion as noted above. In other words, if the MR data acquired during the entire acquisition period is simply used to generate a corresponding image in accordance with conventional techniques, the resulting MR image will include motion artifacts. An example of a conventionally-reconstructed MR image is shown in FIG. 3 as MR image 302. The use of the SENSE plus motion model utilizes the k-space data acquired over the entire acquisition period, together with the motion parameters, to generate the motion corrected initial image 304 as shown in FIGS. 2 and 3.

Again, embodiments include utilizing echoes having an adequately low TE (e.g. echoes 404, 414) to perform the motion estimation by calculating the motion parameters during each of the motion states, and then using echoes with longer TE times (e.g. echo 416) that provides higher contrast images to perform the image reconstruction process to generate the initial motion-corrected image 304, as discussed in further detail below. Additionally, if only a single echo is used, this echo may be implemented together with the non-imaging echo 404 or instead of the non-imaging echo 404 to perform motion estimation, phase estimation, or both, depending upon the value of TE1 or TE2, respectively, as the case may be.

Because the motion parameters are assumed to be known for each of the motion states, which may be acquired in accordance with any suitable techniques as noted above, the motion parameters may be used to generate a reconstructed image that compensates for the motion of the object. To do so, the SENSE plus motion model may be implemented, which is a known technique that assumes rigid motion of the object in accordance with the motion parameters that are correlated to each motion state. Thus, a discussion regarding the SENSE plus motion model is warranted.

As described in further detail in reference [1], The SENSE [31] based rigid-body motion forward model describes the signal acquired in a 2D multishot imaging sequence in accordance with Equations 1a and 1b as follows:

$$s = E\theta x \qquad \text{Eqn. 1a}$$

$$E\theta = \begin{bmatrix} E_{\theta_1} \\ \vdots \\ E_{\theta_{sh}} \end{bmatrix} \qquad \text{Eqn. 1b}$$

where x is a N×1 column vector of the N image voxel values, Eθ is the NC×N forward model operator (encoding matrix) for a given M×1 patient motion trajectory θ, and s is the NC×1 multichannel signal data from C coils. EU is the concatenation of the encoding model for each of the Nsh shots (M=6Nsh for the six rigid-body motion parameters at each shot). The encoding model for each individual shot, l, can be described in Equation 2 as follows:

$$E_{\theta_l} = U_l F C T_l R_l \qquad \text{Eqn. 2}$$

where for shot l, $R_l$ is the rotation operator, $T_l$ is the translation operator, C contains the spatially varying coil sensitivities, F is the Fourier encoding operator, and $U_l$ is the nC×NC undersampling operator, where n is the number of k-space samples acquired per shot (Nshn=N). As described in further detail in reference [1], the motion trajectory θ and the image volume x may be jointly optimized to minimize the data consistency error in accordance with Equation 3 as follows:

$$[\hat{\theta},\hat{x}] = \operatorname{argmin}_{\theta,x} \|s - E_\theta x\|_2 \qquad \text{Eqn. 3}$$

Embodiments include implementing (e.g. via the image computer 17, the system computer 20, etc.) the SENSE plus motion model in accordance with any suitable techniques, which may include the use of TArgeted Motion Estimation and Reduction (TAMER) as described in [1], to reconstruct the image 304 to correct for patient motion. The MR image 304 may thus be reconstructed using the k-space data acquired over the entire acquisition time period and the motion parameters, which are input to and used as part of the SENSE plus motion model. Thus, the reconstruction of the image 304 as shown in FIGS. 2 and 3 may include the use of any suitable known implementations of the SENSE plus motion model or, alternatively, the TAMER technique and SENSE plus motion model as described in [1], which utilizes the parameters and Equations described above and in further detail in [1]. As further discussed below, the embodiments described herein implement additional iterative steps to then optimize over the data consistency error of the SENSE plus motion model to generate refined MR images that correct for both motion and phase variations. Therefore, the MR image 304 that is generated via the use of the SENSE plus motion model reconstruction algorithm may be alternatively referred to in this context as an initial reconstructed MR image or simply as an initial image.

The initial image 304 thus compensates for motion but, as noted above, assumes rigid motion and does not adequately compensate for phase variations. Thus, the initial image 304 includes several artifacts, which can be observed when compared to the ground truth image 308 as shown in FIG. 3. Therefore, the embodiments as described herein compensate for the phase variations that result in such artifacts by incorporating calculated phase information for each of the motion states into the SENSE plus motion model. To do so, embodiments include performing (e.g. via the image computer 17, the system computer 20, etc.) a POCS reconstruction of the initial image 304 to generate a set of projection images, such that each projection image is identified with a respective motion state. This may be performed, for instance, by evaluating a SENSE plus motion model on the initial image 304, which may include feeding the initial image 304 through the SENSE plus motion model to convert the image data to k-space, replacing a portion of this model-generated k-space data with k-space data acquired during each respective motion state, and then converting back to image space via the use of the Adjoint SENSE plus motion operation.

In other words, after feeding the initial image 304 and motion parameters as input into the SENSE plus motion model, model-generated k-space data is calculated and output, which represents motion-corrected k-space data for the entire acquisition time period. With continued reference to FIG. 2, the POCS algorithm is used to replace a portion of the model-generated k-space data for the initial image 304 with the k-space data acquired during motion state 1 to provide modified model-generated k-space data that is converted into a first projected image, to replace the model-generated k-space data with the k-space data acquired during motion state 2 to provide modified model-generated k-space data that is converted into a second projected image, and so on. Of course, the modified model-generated k-space data in each case needs to be converted from the k-space domain to the image domain to actually generate the respective set of projected images via the POCS algorithm. This may be accomplished, for instance, using any suitable techniques to do so, including known techniques. For instance, the plurality of projection images may be generated (e.g. calculated) by applying a Hermitian matrix to the SENSE plus motion model to transform, for each one of the set of projected images, from the modified model-generated k-space data domain to the image domain.

In this way, the POCS algorithm functions to generate N number of projected images as shown in FIG. 2, one for each motion state. Thus, each respective projection image is associated with a projection of the initial image 304 onto each respective motion state. Once the projection images are generated in this manner, one for each motion state as noted above, embodiments include extracting phase information from each of these projection images. The extraction of phase information may be implemented, for instance, by extracting phase differences between the projection images, which may be performed in accordance with any suitable techniques. This may include, for instance, using (e.g. via the image computer 17, the system computer 20, etc.) the projection images to estimate a phase difference map for each motion state. Thus, assuming a number N of motion states, this operation results in N phase difference images. The calculation of the phase difference map data may be implemented, for instance, by performing a low-rank matrix completion algorithm, a scaling algorithm, etc. One particular example of the use of a low-rank matrix completion algorithm to perform the phase extraction in this manner includes the use of parallel imaging using eigenvector maps Iterative Self-consistent Parallel Imaging Reconstruction from Arbitrary k-Space (ESPIRiT), which is described in further detail in reference [2].

With continued reference to FIG. 2, embodiments include calculating (e.g. via the image computer 17, the system computer 20, etc.) a refined image 306 from each of the projection images. This may be performed, for instance, by evaluating the SENSE plus motion model, which now further incorporates the calculated phase of each respective one of the plurality of projection images. For instance, the initial image 304 may be refined in this manner by optimizing over the SENSE plus motion model as noted above and in reference [1]. To do so, a complex multiplication operation may first be performed between the current estimated image (e.g. the initial image 304 in this example, or a subsequent refined image for additional iterations as noted herein) and the estimated phase difference map of the projected images. In other words, the magnitude of the complex image remains the same, but the phase difference map is added to the current phase. This results in the N different projection images, which slightly vary in their phase mappings with respect to one another while the magnitude among the projection images remains the same. As a result, the refined image 306 should now lead to an image with fewer phase-induced artifacts and a smaller data consistency error, as the phase differences between the projection images are input into the SENSE plus motion model. Equation 4 below represents an example of how the calculated phase difference map may be incorporated into the SENSE plus motion model by expanding the encoding model represented in Eqn. 2 above as follows:

$$E_{\theta_l} = U_l F C T_l R_l e^{ip_l} \qquad \text{Eqn. 4:}$$

with $p_l$ denoting the calculated phase difference map for each motion state l.

However, it is noted that a single iteration is typically not sufficient to converge, and thus the aforementioned steps of generating the projected images and then generating the refined image 306 may need to be repeated. For instance, an optimization may be performed over the SENSE plus motion model using the projection images to calculate the refined image 306. For this optimization, a comparison may be implemented between the modified model generated k-space data used to generate each of the projected images to the acquired k-space data such that the refined image 306 may be iteratively refined until a difference between these two k-space objects is minimized to generate the refined image 306. This results in better agreement between the modified model-generated k-space data used to reconstruct the refined image 306 and the acquired k-space data used to reconstruct the initial image 304. This is a result of the BO effects being accounted for in the SENSE plus motion model, which leads to a slightly different phase in every motion state.

For example, a second iteration may include using the refined image 306 in place of the initial image 304 as noted above to again perform the POCS algorithm. Thus, the refined image 306 is fed through the SENSE plus motion model, which now includes the current phase estimate in accordance with Eqn. 4 above, and the POCS algorithm is applied, again replacing the model-generated k-space data with the k-space data acquired during each motion state to generate the N projection images. But, after the first iteration, the current phase estimate may now be used in the second iteration (and subsequent iterations) to account for the motion state dependent phase differences across the N motion states.

This process may then be iteratively repeated using the resulting refined image 306 in each case until the data consistency error improvement, which may be evaluated as part of execution of the algorithm that evaluates the SENSE plus motion model, is smaller than a predetermined threshold value. In other words, the data consistency error represents an error between the actual acquired k-space data and the k-space data generated via the SENSE plus motion model, which includes the current estimate of phase variations across the projection images. The use of the data consistency error as a constraint to the iterative process functions to progressively improve the reconstruction quality of each refined image with each iteration. The predetermined threshold value for the data consistency error improvement, which functions as a stopping criterion for the iterative process, may be any suitable value based upon an acknowledged tradeoff between the elimination of artifacts, processing resources, and time. For instance, the predetermined threshold value for the data consistency error improvement may be 1%, 5%, 10%, etc.

Once the data consistency error improvement predetermined threshold value is reached, the resulting refined image 306 for that iteration of the algorithm may be stored in any suitable memory location, displayed to a user via the display screen 14, etc. In this way, the resulting refined image 306 is the result of a minimization of the consistency error improvement between subsequent iterations, and the resulting refined image 306 compensates for both motion and phase to eliminate or at least reduce motion-induced artifacts.

Figure 5:
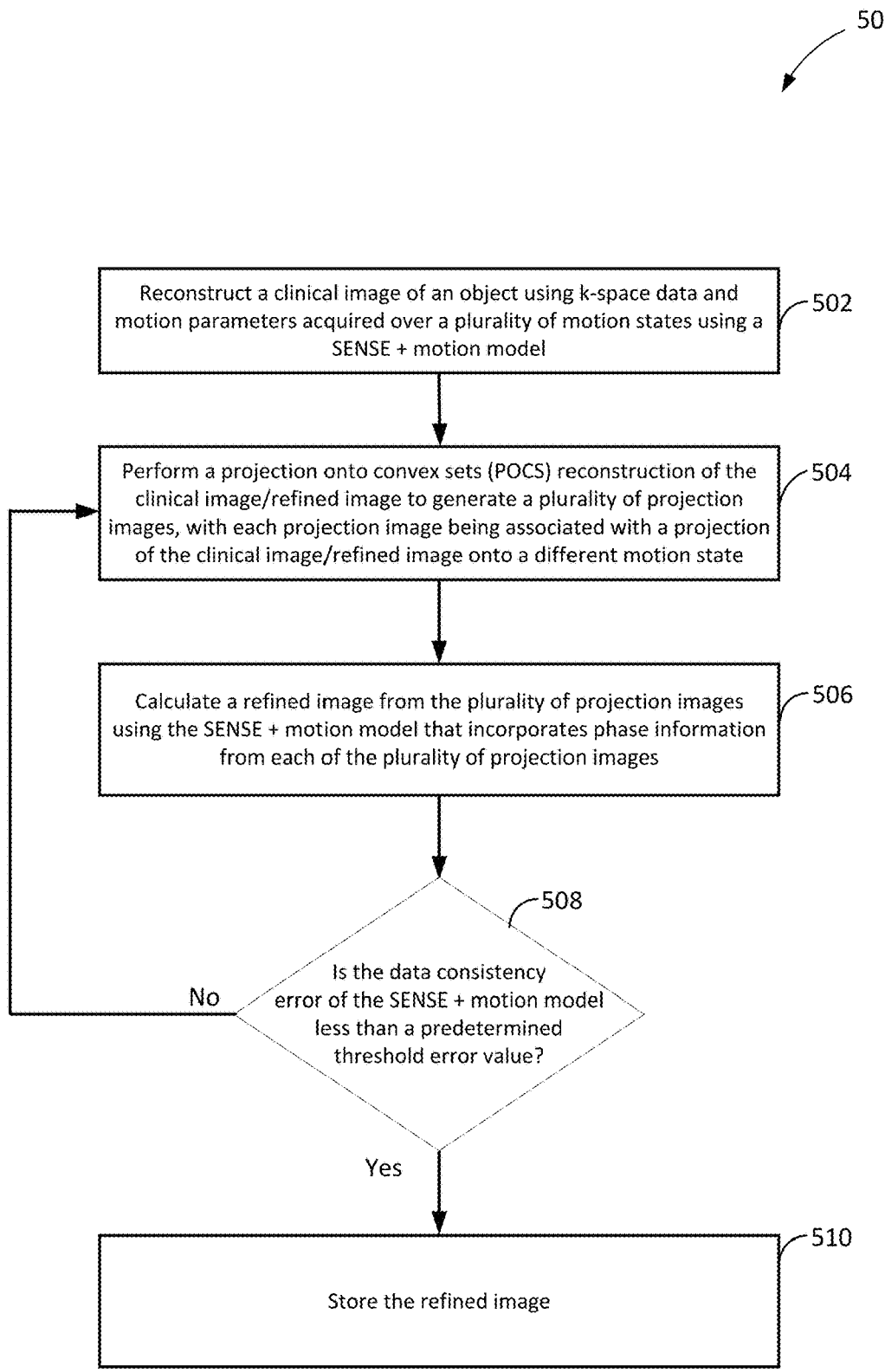
FIG. 5 is an example flow for correcting for motion-induced phase variations, in accordance with an exemplary embodiment of the present disclosure.

FIG. 5 is an example flow for correcting for motion-induced phase variations as a result of motion of an object during an MR scan, in accordance with an exemplary embodiment of the present disclosure. With reference to FIG. 5, which illustrates a flow 500, this flow may be a computer-implemented method executed by and/or otherwise associated with one or more processors and/or storage devices (e.g. the aforementioned memories and/or non-transitory computer-readable media). These processors and/or storage devices may be, for instance, accessible to, integrated with, and/or in communication with the magnetic resonance apparatus 5 (e.g., network storage, external memory, etc.). For example, the one or more processors and/or storage devices may be integrated and/or accessed via the terminal 13, the control device 10 or components thereof such as the system computer 20, the image computer 17, the sequence controller 18, the RF system 22, etc. Moreover, in embodiments, flow 500 may be performed via one or more processors and/or components of the MR apparatus 5 executing instructions stored on a suitable storage medium (e.g., a non-transitory computer-readable storage medium). Embodiments may include alternate or additional steps that are not shown in FIG. 5 for purposes of brevity. Moreover, the blocks are provided in a specific sequential order as shown in the flow 500 by way of example and for ease of explanation. Embodiments include the various steps described in flow 500 being performed in any order with respect to one another, or concurrently when it is suitable to do so.

Flow 500 may begin with one or more processors (e.g., the control computer 20 and/or the image computer 17) reconstructing (block 502) a clinical image of an object using k-space data and motion parameters acquired over an entire data acquisition time period, which may comprise any suitable number N of motion states or shots. This image may correspond, for instance, to the initial image 304 as shown and discussed herein with reference to FIGS. 2 and 3. The image may be reconstructed in this manner by using a SENSE plus motion model, as discussed herein, such that the reconstructed image compensates for motion-induced artifacts but does not compensate for phase variation artifacts. The motion parameters may be acquired in any suitable manner as discussed herein to identify the motion an object during each motion state.

Flow 500 may further include one or more processors (e.g., the control computer 20 and/or the image computer 17) performing (block 504) a POCS algorithm reconstruction of the initial image to generate a plurality of projection images. Again, each projection image may be associated with a projection of the initial reconstructed image onto each of the motion states, as noted above with respect to FIGS. 2 and 3. Thus, the POCS reconstruction of the initial image may result in the calculation/generation of N number of projected images, with N being equal to the number of motion states.

Flow 500 may further include one or more processors (e.g., the control computer 20 and/or the image computer 17) calculating (block 506) a refined image from the N projection images. This may include, for instance, using the SENSE plus motion model to further incorporate the estimated phase information. Again, this phase information may be estimated using phase map information that is extracted from each of the projection images, as noted herein with reference to FIGS. 2 and 3. The refined image may be identified, for instance, with the refined image 306, as discussed herein with reference to FIGS. 2 and 3.

Flow 500 may further include one or more processors (e.g., the control computer 20 and/or the image computer 17) determining (block 508) whether the data consistency error improvement resulting from the use of the SENSE plus motion model used to calculate (block 506) the refined image is less than a predetermined threshold error value. If so, then the phase estimation for each of the plurality of motion states has converged to an acceptable (e.g. optimized) solution, and thus the current iteration may be the last iteration in the flow 500, in which case the resulting refined image at this iteration is stored (block 510) in a suitable location, displayed, etc.

However, if the data consistency error improvement resulting from the use of the SENSE plus motion model used to calculate (block 506) the refined image is greater than the predetermined threshold error value, the flow 50 includes iteratively repeating the process of performing (block 504) the POCS reconstruction from the current refined image (e.g. the refined image from the previous iteration) to calculate the projection images, and then calculating (block 506) further refined images until a data consistency error improvement of the SENSE plus motion model is less than the predetermined threshold value.

The iterative process described herein, which may be referred to as a phase-variation compensation algorithm, may be used to reduce or eliminate phase-variation induced artifacts in reconstructed images. This phase-variation compensation algorithm may be modified or combined with other techniques to further improve upon the manner in which the technique is implemented and/or the results obtained. For example, the described phase estimation techniques discussed herein, which generate phase difference maps for each of the projection images, may alternatively be executed as part of a standard motion parameter search as described in [1]. However, doing so would result in longer reconstruction time.

Furthermore, because the phase variations resulting from object motion do not tend to have high-frequency components, the iterative process described herein may be performed at a lower spatial resolution than a typical MRI scan, which may save processing power required to perform the iterations and generate the resulting motion- and phase-corrected images. For instance, the phase-variation compensation algorithm may be divided into different operational phases to implement lower-resolution calculations. As an illustrative example, the phase-variation compensation algorithm may first be performed using a lower spatial resolution with respect to the acquired k-space data, which may be a fraction or subset of the overall k-space data that is typically used for higher resolution calculations such as 75%, 50%, 25%, etc. During this first phase, the phase-variation compensation algorithm may be executed such that the initial image is calculated from the lower resolution k-space data, the POCS algorithm is used to generate the projection images, the phase difference maps are calculated, and then the refined image is reconstructed, which has a lower spatial resolution. In other words, the phase-variation compensation algorithm is used to iteratively perform phase estimation at a low spatial resolution to save computational cost. This results in a final low resolution phase map and an artifact-free low resolution image (e.g. the refined image 306 as discussed herein).

Then, to obtain a desired high resolution artifact-free image, a second phase may be implemented in which the low-resolution phase map is scaled up to a high resolution grid, which may be performed in accordance with any suitable techniques, including known image interpolation techniques. For this second phase, an optimization may be performed of the SENSE plus motion model over a single iteration, which now includes the upsampled phase information and performs each operation at the full image resolution. This results in the reconstruction of a desired artifact-free high resolution image. Performing the phase-variation compensation calculations in this manner may be particularly useful to save computational time and resources.

Moreover, a reordering operation may further facilitate an improvement to the accuracy of the phase estimation by optimizing the reordering of the acquired k-space data across each of the motion states. That is, a reordering optimization may be implemented (e.g., the control computer 20 and/or the image computer 17) such that the k-space data acquired for each respective motion state contains a homogenous distribution of k-space samples around the center of k-space. This technique is further described in reference [3] with reference to motion estimation, and a similar technique may be implemented to perform the phase estimation calculations as discussed herein. That is, each shot or motion state covers a small portion of the k-space acquired over the acquisition time period, i.e. the k-space data acquired during each motion state is undersampled. Thus, the k-space data or samples associated with each motion state cover a localized region of k-space, and may be re-ordered, per each respective motion state, to be equally spread out (i.e. homogenously distributed) across the k-space data samples around the center of k-space. Such a reordering may be particularly advantageous as phase variations mainly contain low-resolution information, and if a specific motion state/shot only contains high frequency k-space data, the estimation of a low-resolution phase map from this high frequency k-space data would be difficult or not possible.

Moreover, other known techniques for image acquisition and motion estimation may be synergistically combined with the phase-variation compensation algorithm. For example, a technique known as Scout Acquisition enables rapid Motion Estimation and Reduction (SAMER) may be implemented to increase the speed for non-linear motion parameter search, which may dramatically reduce the computational cost and reconstruction speed. As an example, SAMER uses a scout scan that is performed prior to the imaging scans to estimate the motion parameters. For example, SAMER embodiments compare the scout scan to the data acquired during each of the motion states, which may be k-space data that is acquired during any suitable acquisition time period to calculate the motion parameters. Advantageously, this acquisition time period may be identified with the aforementioned non-imaging or imaging echo having a minimum or adequately small TE value as noted above. Additional details regarding the use of SAMER techniques may be found in reference [4]. The use of SAMER techniques are described herein as one illustrative example, and the embodiments herein may implement SAMER or any other suitable type of navigator-free retrospective motion correction techniques to estimate the initial motion parameters, as discussed herein.

Still further, any of the techniques described herein may be combined with the use of Wave-controlled aliasing in parallel imaging (Wave-CAIPI), which is described in further detail in reference [5]. Wave-CAIPI embodiments may be particularly useful, for instance, when the k-space acquired over the entire acquisition time period is highly undersampled, as Wave-CAIPI enables an encoding capability at a high acceleration.

The embodiments described herein thus address the current issues with conventional techniques that fail to adequately address motion- and phase-induced artifacts in reconstructed images of objects that move during MRI scans. For instance, the embodiments described herein function to estimate background phase variations across shots/motion states, and thus improve the image quality in retrospective motion correction. Moreover, phase variations may be estimated using the acquired k-space data without additional calibration scans, which saves time and thus provides a particularly efficient solution. Also, phase estimation between motion states may be performed at a low spatial resolution, which realizes a potential for online reconstruction with clinically acceptable reconstruction time. And, for GRE/SWI, the acquisition of an additional echo at a minimal TE, as noted herein, may facilitate more accurate motion parameter estimation (e.g. by reducing susceptibility to magnetic field variations).

Although the present disclosure has been illustrated and described in detail with the preferred exemplary embodiments, the disclosure is not restricted by the examples given, and other variations can be derived therefrom by a person skilled in the art without departing from the protective scope of the disclosure. Although modifications and changes may be suggested by those skilled in the art, it is the intention to embody all changes and modifications as reasonably and properly come within the scope of their contribution to the art.

It is also pointed out for the sake of completeness that the use of the indefinite articles "a" or "an" does not exclude the possibility that the features in question may also be present more than once. Similarly, the term "unit" does not rule out the possibility that the same consists of a plurality of components which, where necessary, may also be distributed in space.

The claims described herein and the following description in each case contain additional advantages and developments of the embodiments as described herein. In various embodiments, the claims of one claims category can, at the same time, be developed analogously to the claims of a different claims category and the parts of the description pertaining thereto. Furthermore, the various features of different exemplary embodiments and claims may also be combined to create new exemplary embodiments without departing from the spirit and scope of the disclosure.

REFERENCES

The following references are cited throughout this disclosure as applicable to provide additional clarity, particularly with regards to terminology. These citations are made by way of example and ease of explanation and not by way of limitation.

Citations to the following references are made throughout the application using a matching bracketed number, e.g., [1].

[1] M. W. Haskell, S. F. Cauley, and L. L. Wald, "TArgeted Motion Estimation and Reduction (TAMER): Data Consistency Based Motion Mitigation For Mri Using A Reduced Model Joint Optimization," IEEE Trans. Med. Imaging, vol. 37, no. 5, pp. 1253-1265, 2018.

[2] M. Uecker et al., "ESPIRiT—An eigenvalue approach to autocalibrating parallel MRI: Where SENSE meets GRAPPA," Magn. Reson. Med., vol. 71, no. 3, pp. 990-1001, Mar. 2014.

[3] L. Cordero-Grande, G. Ferrazzi, R. P. A. G. Teixeira, J. O'Muircheartaigh, A. N. Price, and J. V. Hajnal, "Motion-corrected MRI with DISORDER: Distributed and incoherent sample orders for reconstruction deblurring using encoding redundancy," Magn. Reson. Med., 2020.

[4] Polak D, Splitthoff D N, Clifford B, et al. "Scout accelerated motion estimation and reduction (SAMER)." Magn Reson Med. 2021; https://doi.org/10.1002/mrm.28971.

[5] B. Bilgic et al., "Wave-CAIPI for highly accelerated 3D imaging," Magn. Reson. Med., vol. 73, no. 6, pp. 2152-2162, 2015.

What is claimed is:

1. A method for acquiring clinical images of an object that is moving during at least a portion of a magnetic resonance imaging (MRI) scan, comprising:

generating, via one or more processors using a SENSitivity Encoding (SENSE) plus motion model reconstruction, an initial image of the object using k-space data and motion parameters that are acquired over a plurality of motion states of the object;

performing, via one or more processors, a projection onto convex sets (POCS) reconstruction of the initial image to generate a plurality of projection images such that each respective one of the plurality of projection images is associated with a projection of the initial image onto each respective one of the plurality of motion states motion states;

calculating, via one or more processors, a refined image from each one of the plurality of projection images using the SENSE plus motion model that further incorporates a calculated phase difference map for each motion state corresponding to each respective one of the plurality of projection images;

iteratively repeating (i) performing the POCS reconstruction from refined images calculated in a previous iteration to calculate a plurality of projection images, and (ii) calculating a further refined image from the plurality of projection images until a data consistency error improvement of the SENSE plus motion model is less than a predetermined threshold value; and storing, in a data storage, a calculated refined image corresponding to an iteration in which the data consistency error improvement is less than the predetermined threshold value.

2. The method of claim 1, wherein the act of generating the initial image comprises optimizing over the data consistency error of the SENSE plus motion model.

3. The method of claim 1, wherein the plurality of projection images are calculated by (i) evaluating the SENSE plus motion model using the refined image and the motion parameters to calculate model-generated k-space data, and (ii) replacing a portion of the model-generated k-space data with k-space data acquired during each respective one of the plurality of motion states to generate modified model-generated k-space data.

4. The method of claim 3, wherein the plurality of projection images are calculated by applying a Hermitian matrix to the SENSE plus motion model to transform from a modified model-generated k-space data domain to an image domain.

5. The method of claim 1, further comprising:
calculating, via one or more processors, the phase difference map of each respective one of the plurality of projection images using a low rank matrix completion algorithm.

6. The method of claim 5, wherein the low rank matrix completion algorithm comprises a parallel imaging using eigenvector maps Iterative Self-consistent Parallel Imaging Reconstruction from Arbitrary k-Space (ESPIRiT).

7. The method of claim 1, wherein k-space data acquired for each respective motion state represents a homogenous distribution of the k-space data across k-space.

8. The method of claim 1, further comprising:
acquiring the motion parameters for each respective motion state using a non-imaging echo having an echo time (TE) that is less than a TE associated with one or more imaging echoes.

9. The method of claim 8, wherein the non-imaging echo time (TE) is less than 3 milliseconds.

10. The method of claim 1, further comprising:
acquiring the motion parameters for each respective motion state using an imaging echo having an echo time (TE) that is less than 10 milliseconds.

11. A non-transitory computer readable medium having instructions stored thereon that, when executed by one or more processors of a magnetic resonance apparatus, cause the magnetic resonance apparatus to acquire clinical images of an object that is moving during at least a portion of a magnetic resonance imaging (MRI) scan by:
generate, using a SENSitivity Encoding (SENSE) plus motion model reconstruction, an initial image of the object using k-space data and motion parameters that are acquired over a plurality of motion states of the object;
perform a projection onto convex sets (POCS) reconstruction of the initial image to generate a plurality of projection images such that each respective one of the plurality of projection images is associated with a projection of the initial image onto each respective one of the plurality of motion states motion states;
calculate a refined image from each one of the plurality of projection images using the SENSE plus motion model that further incorporates a calculated phase difference map for each motion state corresponding to each respective one of the plurality of projection images;
iteratively repeat (i) performing the POCS reconstruction from refined images calculated in a previous iteration to calculate a plurality of projection images, and (ii) calculating a further refined image from the plurality of projection images until a data consistency error improvement of the SENSE plus motion model is less than a predetermined threshold value; and
store a calculated refined image corresponding to an iteration in which the data consistency error improvement is less than the predetermined threshold value.

12. The non-transitory computer readable medium of claim 11, wherein the instructions cause the one or more processors of the magnetic resonance apparatus to generate the initial image by optimizing over the data consistency error of the SENSE plus motion model.

13. The non-transitory computer readable medium of claim 11, wherein the instructions cause the one or more processors of the magnetic resonance apparatus to calculate the plurality of projection images by (i) evaluating the SENSE plus motion model using the refined image and the motion parameters to calculate model-generated k-space data, and (ii) replacing a portion of the model-generated k-space data with k-space data acquired during each respective one of the plurality of motion states to generate modified model-generated k-space data.

14. The non-transitory computer readable medium of claim 13, wherein the instructions cause the one or more processors of the magnetic resonance apparatus to calculate the plurality of projection images by applying a Hermitian matrix to the SENSE plus motion model to transform from a modified model-generated k-space data domain to an image domain.

15. The non-transitory computer readable medium of claim 11, wherein the instructions cause the one or more processors of the magnetic resonance apparatus to calculate the phase difference map of each respective one of the plurality of projection images using a low rank matrix completion algorithm.

16. The non-transitory computer readable medium of claim 15, wherein the low rank matrix completion algorithm comprises a parallel imaging using eigenvector maps Iterative Self-consistent Parallel Imaging Reconstruction from Arbitrary k-Space (ESPIRiT).

17. The non-transitory computer readable medium of claim 11, wherein k-space data acquired for each respective motion state represents a homogenous distribution of the k-space data across k-space.

18. The non-transitory computer readable medium of claim 11, wherein the instructions cause the one or more processors of the magnetic resonance apparatus to acquire the motion parameters for each respective motion state using a non-imaging echo having an echo time (TE) that is less than a TE associated with one or more imaging echoes.

19. The non-transitory computer readable medium of claim 18, wherein the non-imaging echo time (TE) is less than 3 milliseconds.

20. The non-transitory computer readable medium of claim 11, wherein the instructions cause the one or more processors of the magnetic resonance apparatus to acquire the motion parameters for each respective motion state using an imaging echo having an echo time (TE) that is less than 10 milliseconds.

* * * * *